(12) United States Patent
Liou et al.

(10) Patent No.: US 10,319,856 B2
(45) Date of Patent: Jun. 11, 2019

(54) SEMICONDUCTOR DEVICE

(71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu, Taiwan (TW)

( * ) Notice: Subject to any disclaimer, the term of this patent is extended or adjusted under 35 U.S.C. 154(b) by 0 days.

(21) Appl. No.: 15/832,755

(22) Filed: Dec. 5, 2017

(65) Prior Publication Data
US 2018/0097109 A1 Apr. 5, 2018

Related U.S. Application Data

(60) Continuation of application No. 15/628,658, filed on Jun. 21, 2017, now Pat. No. 9,871,138, which is a (Continued)

(30) Foreign Application Priority Data

Nov. 12, 2015 (CN) .......................... 2015 1 0769647

(51) Int. Cl.
*H01L 29/32* (2006.01)
*H01L 29/34* (2006.01)
*H01L 29/66* (2006.01)
*H01L 29/78* (2006.01)
*H01L 29/08* (2006.01)
*H01L 29/16* (2006.01)
*H01L 29/161* (2006.01)
*H01L 29/165* (2006.01)
*H01L 29/24* (2006.01)
*H01L 21/02* (2006.01)
(Continued)

(52) U.S. Cl.
CPC .... *H01L 29/7847* (2013.01); *H01L 21/02521* (2013.01); *H01L 21/02529* (2013.01); *H01L 21/02667* (2013.01); *H01L 21/26526* (2013.01); *H01L 21/324* (2013.01); *H01L 29/0847* (2013.01); *H01L 29/161* (2013.01); *H01L 29/165* (2013.01); *H01L 29/1608* (2013.01); *H01L 29/24* (2013.01); *H01L 29/32* (2013.01); *H01L 29/34* (2013.01); *H01L 29/66636* (2013.01); *H01L 29/7848* (2013.01)

(58) Field of Classification Search
CPC ..................... H01L 29/7847; H01L 29/7848
See application file for complete search history.

(56) References Cited

U.S. PATENT DOCUMENTS 8,193,049 B2 6/2012 Golonzka
8,629,046 B2 1/2014 Tsai
(Continued)

*Primary Examiner* — Charles D Garber
*Assistant Examiner* — Alia Sabur
(74) *Attorney, Agent, or Firm* — Winston Hsu

(57) ABSTRACT

The present invention provides a semiconductor device, including a substrate, two gate structures disposed on a channel region of the substrate, an epitaxial layer disposed in the substrate between two gate structures, a first dislocation disposed in the epitaxial layer, wherein the profile of the first dislocation has at least two non-parallel slanting lines, and a second dislocation disposed adjacent to a top surface of the epitaxial layer, and the profile of the second dislocation has at least two non-parallel slanting lines.

14 Claims, 8 Drawing Sheets

Related U.S. Application Data division of application No. 14/960,444, filed on Dec. 7, 2015, now Pat. No. 9,722,080.

(51) Int. Cl.
*H01L 21/265* (2006.01)
*H01L 21/324* (2006.01)

(56) References Cited

U.S. PATENT DOCUMENTS

| | | |
|---|---|---|
| 8,674,453 B2 | 3/2014 | Tsai |
| 8,723,266 B2 | 5/2014 | Tsai |
| 8,754,477 B2 | 6/2014 | Lu |
| 8,779,477 B2 | 7/2014 | Weber |
| 8,828,817 B2 | 9/2014 | Lu |
| 8,866,235 B2 | 10/2014 | Wu |
| 8,877,599 B2 | 11/2014 | Fang |
| 8,890,258 B2 | 11/2014 | Wang |
| 8,916,428 B2 | 12/2014 | Wang |
| 8,981,530 B2 | 3/2015 | Chuang |
| 9,362,278 B1 | 6/2016 | Huang |
| 2007/0262396 A1* | 11/2007 | Zhu .................. H01L 21/76816 257/401 |
| 2012/0104474 A1* | 5/2012 | Yin ................ H01L 21/823814 257/288 |
| 2013/0099314 A1 | 4/2013 | Lu |
| 2014/0048886 A1 | 2/2014 | Chuang |
| 2014/0134818 A1 | 5/2014 | Cheng |
| 2014/0346576 A1 | 11/2014 | Lu |
| 2014/0374831 A1 | 12/2014 | Liaw |
| 2015/0132913 A1 | 5/2015 | Hong |
| 2015/0294881 A1 | 10/2015 | Tsai |
| 2015/0295085 A1* | 10/2015 | Yu ...................... H01L 29/7847 257/401 |
| 2016/0049511 A1* | 2/2016 | Kim ................... H01L 29/7848 257/401 |
| 2016/0204256 A1* | 7/2016 | Jackson ................ H01L 29/32 257/288 |

\* cited by examiner

SEMICONDUCTOR DEVICE

CROSS REFERENCE TO RELATED APPLICATIONS

This application is a continuation application of U.S. patent application Ser. No. 15/628,658 filed Jun. 21, 2017, which is a divisional application of U.S. patent application Ser. No. 14/960,444 filed Dec. 7, 2015, which is herein incorporated by reference in its entirety.

BACKGROUND OF THE INVENTION

1. Field of the Invention

The present invention relates to the field of semiconductor technology, and more particularly, to a mechanism for the improving the stress efficiency in the source region in a semiconductor device.

2. Description of the Prior Art

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as a metal-oxide-semiconductor field-effect transistors (MOSFETs), are scaled down through various technology nodes, strained source/drain features (e.g., stressor regions) have been implemented to enhance carrier mobility and improve device performance. Stress distorts or strains the semiconductor crystal lattice, which affects the band alignment and charge transport properties of the semiconductor. By controlling the magnitude and distribution of stress in a finished device, manufacturers can increase carrier mobility and improve device performance. Although existing approaches to forming stressor regions for IC devices have been generally adequate for their intended purposes, they have not been entirely satisfactory in all respects.

SUMMARY OF THE INVENTION

The present invention provides a semiconductor device, comprising a substrate, two gate structures disposed on a channel region of the substrate, an epitaxial layer disposed in the substrate between two gate structures, and a first dislocation disposed in the epitaxial layer, wherein the profile of the first dislocation has at least two non-parallel slanting lines, and a second dislocation disposed adjacent to a top surface of the epitaxial layer, and the profile of the second dislocation has at least two non-parallel slanting lines.

The present invention further provides a semiconductor device, comprising a substrate, two gate structures disposed on a channel region of the substrate, and two spacers disposed on two sides of each gate structure, an epitaxial layer disposed in the substrate between two gate structures, and a second dislocation disposed adjacent to a top surface of the epitaxial layer, the second dislocation contacting the spacer directly, the profile of the second dislocation having at least two first lines and at least two second lines, and the first line not being parallel to the second line.

The present invention further provides a method for forming a semiconductor device, comprising the following steps: firstly, a substrate is provided, next, two gate structures are formed on a channel region of the substrate, afterwards, an epitaxial layer is formed in the substrate between two gate structures, wherein the epitaxial layer comprises a first dislocation disposed therein, the profile of the first dislocation is a reverse V shaped profile, a second dislocation is disposed adjacent to a top surface of the epitaxial layer, and the profile of the second dislocation is a V shaped profile.

The embodiments of processes and structures of the present invention provide a mechanism for improving mobility of carriers. The dislocations in the source and drain regions and the tensile stress created by the doped epitaxial materials next to the channel region of a transistor both contribute to the tensile stress in the channel region. In particular, the tensile stress is good for improving the mobility of carriers of an NMOS transistor. In the present invention, except for the first dislocation being formed within the epitaxial layer, at least one second dislocation is formed near the surface of the epitaxial layer, and both the two dislocations contribute to the tensile stress, thereby further improving the device performance.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
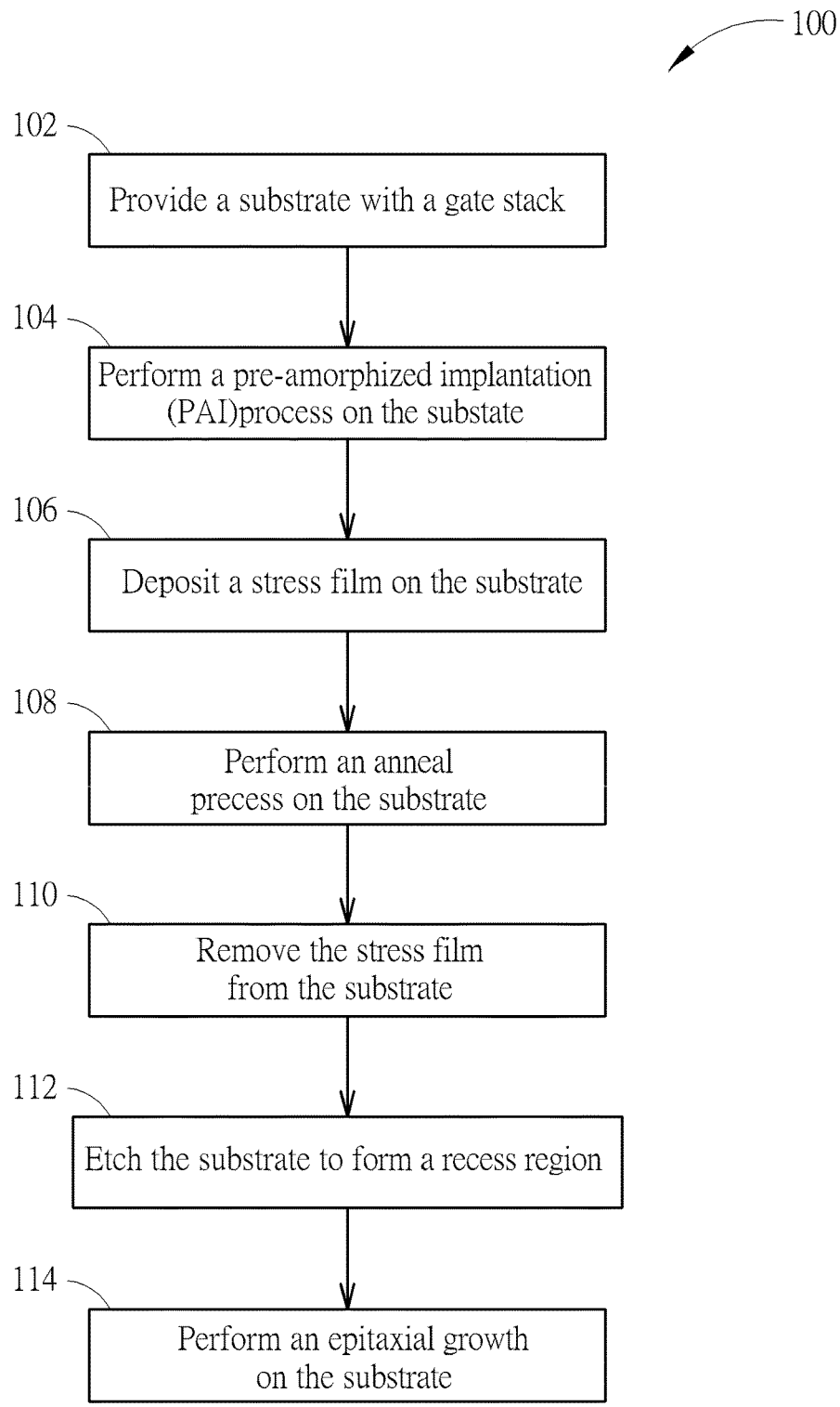
FIG. 1 is a flowchart illustrating a method of forming a semiconductor device according to various aspects of the present disclosure.

Please refer to FIG. 1, and FIG. 2 to FIG. 8. FIG. 1 shows a flow diagram of a method for forming a semiconductor device of the present invention. FIG. 2 to FIG. 8 illustrate the cross section diagram of a portion of a semiconductor device 200 according to the first preferred embodiment of the present invention. In the present invention, the semiconductor device 200 at least comprises an N-type metal-oxide-semiconductor (NMOS). In other embodiments, the semiconductor device 200 also comprises active devices such as metal-oxide-semiconductor field effect transistors (MOSFETs), complementary metal-oxide-semiconductor (CMOS) transistors, high voltage transistors, and/or high frequency transistors; other suitable components; and/or combinations thereof. In some embodiments, the semiconductor device 200 additionally includes passive components, such as resistors, capacitors, inductors, and/or fuses. In some embodiments, the semiconductor device 200 is formed by CMOS technology processing, and thus some processes are not described in detail herein.

Referring to FIG. 1, a method 100 for fabricating a semiconductor device is described according to various aspects of the present disclosure. The method 100 begins with step 102 in which a substrate is provided. The substrate includes a gate structure with a gate stack. The method 100 continues with step 104 in which a pre-amorphous implantation (PAI) process is performed on the substrate. The method 100 continues at step 106 in which a stress film is deposited on the substrate. The method 100 continues at step 108 in which an anneal process is performed on the substrate. The method 100 continues at step 110 in which the stress film is removed. The method 100 continues at step 112 in which a recess is formed on the substrate by etching. The method 100 continues at step 114 in which an epitaxial growth is performed on the substrate. The discussion that follows illustrates various embodiments of a semiconductor device 200 that can be fabricated according to the method 100 of FIG. 1.

Figure 2:
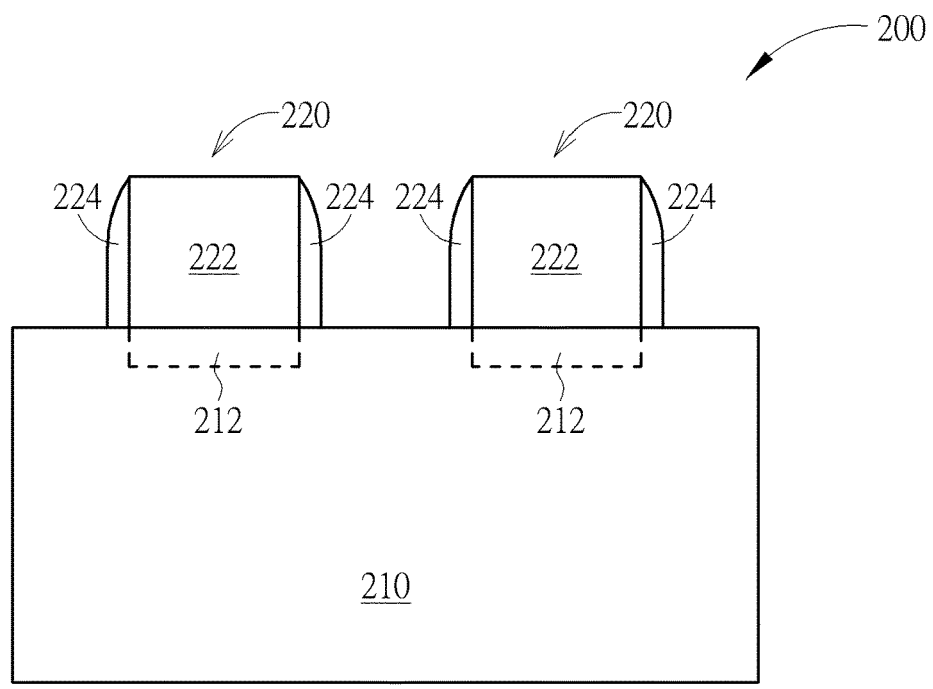
FIGS. 2 to 7 illustrate diagrammatic cross-sectional side views of one or more embodiments of a semiconductor device according to the method of FIG. 1.

FIGS. 2 to 8 illustrate diagrammatic cross-sectional side views of one or more embodiments of a semiconductor device 200 at various stages of fabrication according to the method 100 of FIG. 1. Referring to FIG. 2, the semiconductor device 200 includes a substrate 210. In the present embodiment, the substrate 210 is a semiconductor substrate including silicon. Alternatively, the substrate 210 includes an elementary semiconductor including silicon and/or germanium in crystal. In yet another alternative, the semiconductor substrate is a semiconductor on insulator (SOI).

The substrate 210 includes various doped regions depending on design requirements as known in the art (e.g., p-type wells or n-type wells). The doped regions are doped with p-type dopants, such as boron or BF2, and/or n-type dopants, such as phosphorus or arsenic. The doped regions include various active regions, such as regions configured for an N-type metal-oxide-semiconductor transistor (referred to as an NMOS) and regions configured for a P-type metal-oxide-semiconductor transistor (referred to as a PMOS).

It is noteworthy that the semiconductor device described below are disposed within the NMOS transistor region, in other words, the semiconductor device belongs to a NMOS transistor device. The reason is the dislocation that formed in the following steps will provide a tensile stress, the tensile stress is good for improving the performance of a NMOS transistor, but not suitable for a PMOS transistor, it will be described again in the following paragraphs. Of course, the semiconductor device of the present invention may further comprise a PMOS transistor, however, the PMOS transistor is not for by the method 100 shown in FIG. 1, but it is formed by other suitable methods.

In some embodiments, the substrate 210 includes an isolation region to define and isolate various active regions of the substrate 210. The isolation region utilizes isolation technology, such as shallow trench isolation (STI) or local oxidation of silicon (LOCOS), to define and electrically isolate the various regions. The isolation region includes silicon oxide, silicon nitride, silicon oxynitride, other suitable materials, or combinations thereof.

With further reference to FIG. 2, the substrate 210 includes gate structures 220 disposed over channel regions. In some embodiments, the substrate 210 further includes a source region and a drain region on both sides of one of the gate structures 220, the channel region being the region between the source region and the drain region. In some embodiments, lightly-doped drains (LDDs) are formed in substrate 210. In some embodiments, portions of the LDDs are formed under the gate structures 220. For NMOS transistors, N-type lightly-doped drains (LDDs) are formed of n-type dopants, such as phosphorous, arsenic, and/or other group V elements. In some embodiments, P-type pocket doped regions are also formed in substrate 210.

The gate structure 220 includes various gate material layers. In the present embodiment, the gate structure 220 includes a gate stack 222, which includes one or more gate dielectric layer and a gate electrode. In some embodiments, the gate structure 220 also includes gate spacers 224 disposed on sidewalls of the gate stack 222.

The gate stack 222 is formed over the substrate 210 to a suitable thickness. In an example, the gate stack 222 includes a polycrystalline silicon (or polysilicon) layer. In some embodiments, the polysilicon layer is doped for proper conductivity. Alternatively, the polysilicon is not necessarily doped. In another example, the gate stack 222 includes a conductive layer having a proper work function; therefore, the gate stack 222 is also referred to as a work function layer. The work function layer includes a suitable material, such that the layer is tuned to have a proper work function for enhanced performance of the device. For example, if an N-type work function metal (N-metal) for an NMOS device is desired, Ta, TiAl, TiAlN, or TaCN, is used. In some embodiments, the work function layer includes doped conducting oxide materials. In some embodiments, the gate stack 222 includes other conductive materials, such as aluminum, copper, tungsten, metal alloys, metal silicide, other suitable materials, and/or combinations thereof. In some embodiments, the gate stack 222 includes multiple layers. In some embodiments, the gate stack 222 is formed by chemical vapor deposition (CVD), physical vapor deposition (PVD), atomic layer deposition (ALD), high density plasma CVD (HDPCVD), plating, other suitable methods, and/or combinations thereof.

The gate spacers 224 are formed over the substrate 210 by any suitable process to any suitable thickness. The gate spacers 224 include a dielectric material, such as silicon nitride, silicon oxide, silicon oxynitride, other suitable materials, and/or combinations thereof.

Figure 3:
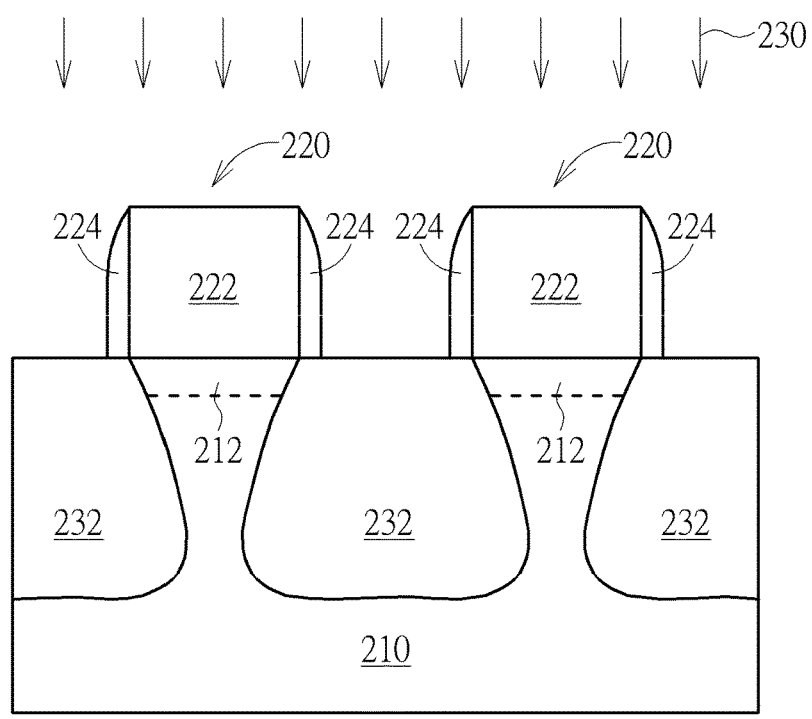

Referring to FIG. 3, a pre-amorphous implantation (PAI) process 230 is performed on the substrate 210. The PAI process 230 implants the substrate 210 with some species. The implanted species damages the lattice structure of the substrate 210 and forms an amorphized region 232. In some embodiments, the implanted species scatters in substrate 210. The scattered species causes lateral amorphization, which results in amorphized region 232 extending to regions underneath the spacers 224. In some embodiments, the amorphized region 232 is formed in a source and drain region of the semiconductor device 200 and does not extend beyond the center line 226 of the gate structure 220. The amorphized region 232 has a depth 234. The amorphized depth 234 is formed according to design specifications. In some embodiments, the amorphized depth 234 is in a range from about 10 to about 150 nanometers. In some embodiments, the amorphized depth 234 is less than about 100 nanometers.

Referring to FIG. 3, a pre-amorphous implantation (PAI) process 230 is performed on the substrate 210. The PAI process 230 implants the substrate 210 with some species. The implanted species damages the lattice structure of the substrate 210 and forms an amorphized region 232. In some embodiments, the implanted species scatters in substrate 210. The scattered species causes lateral amorphization, which results in amorphized region 232 extending to regions underneath the spacers 224. In some embodiments, the amorphized region 232 is formed in a source and drain region of the semiconductor device 200.

In some embodiments, a patterned photoresist layer is utilized to define where the amorphized region 232 is formed and to protect other regions of the semiconductor device 200 from implantation damage. For example, the PMOS regions are protected. In addition, the patterned photoresist layer exposes the source/drain regions, such that the source/drain regions are exposed to the PAI process 230 (forming amorphized region 232) while the gate structure 220 and other portions of the semiconductor device 200 are protected from the PAI process 230. Alternatively, a patterned hard mask layer, such as a SiN or SiON layer, is utilized to define the amorphized region. In some embodiments, the patterned photoresist layer or the patterned hard mask layer is part of the current manufacturing process, for example lightly-doped drains (LDD) or source/drain formation, thereby minimizing cost as no additional photoresist layer or hard mask is required for the PAI process 230. After the PAI process is performed, the photoresist on substrate 210 is removed.

Figure 4:
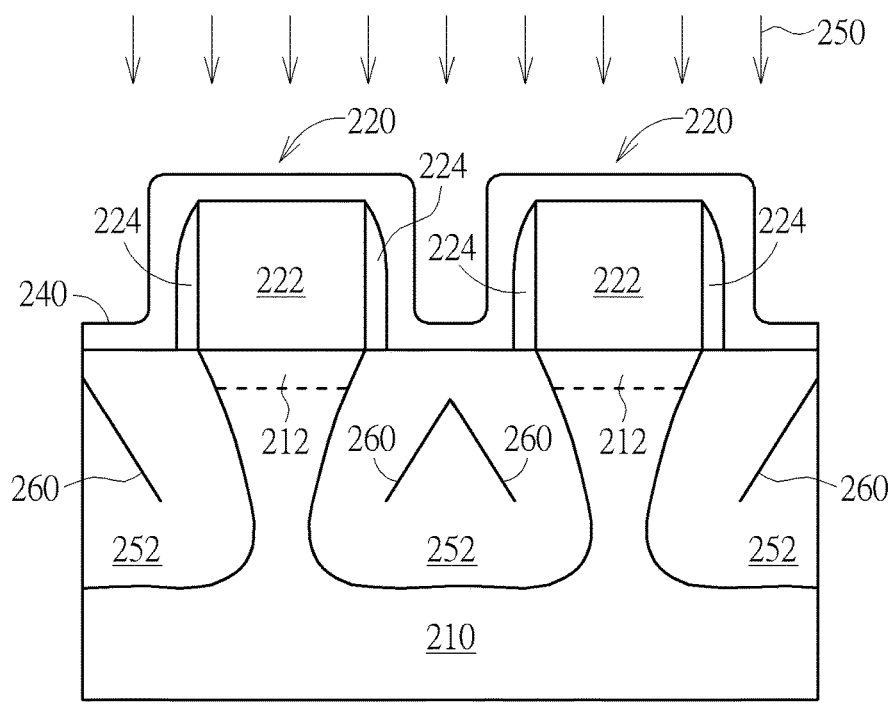

Referring to FIG. 4, a stress film 240 is deposited over the substrate 210. In some embodiments, the stress film 240 is formed by chemical vapor deposition (CVD), physical vapor deposition (PVD), atomic layer deposition (ALD), high density plasma CVD (HDPCVD), plating, other suitable methods, and/or combinations thereof. In some embodiments, the stress film 240 includes a dielectric material, such as silicon nitride, silicon oxide, silicon oxynitride, other suitable materials, and/or combinations thereof. Next, an annealing process 250 is performed on the substrate 210. The annealing process 250 causes the amorphized regions 232 to re-crystallize, forming re-crystallization region 252. In some embodiments, the annealing process 250 is a furnace process, a rapid thermal annealing (RTA) process, a millisecond thermal annealing (MSA) process (for example, a millisecond laser thermal annealing process), or a microsecond thermal annealing (μSA) process. This process is often referred to as solid-phase epitaxy (SPE).), and thus, the re-crystallization region 252 is referred to as an epitaxial region. Since the stress film 240 has tensile stress, which affects the recrystallization process. For example, the stress film 240 could retard the growth rate in the [110] direction of the re-crystallization region 252.

During the annealing process 250, as the substrate 210 recrystallizes, at least one first dislocation 260 is formed in the re-crystallization region 252. In some embodiments, the dislocations 260 are formed in the [111] direction. In some embodiments, the [111] direction has an angle in a range from about 45 to about 65 degrees, the angle being measured with respect to an axis parallel to a surface of the substrate 210.

Figure 5:
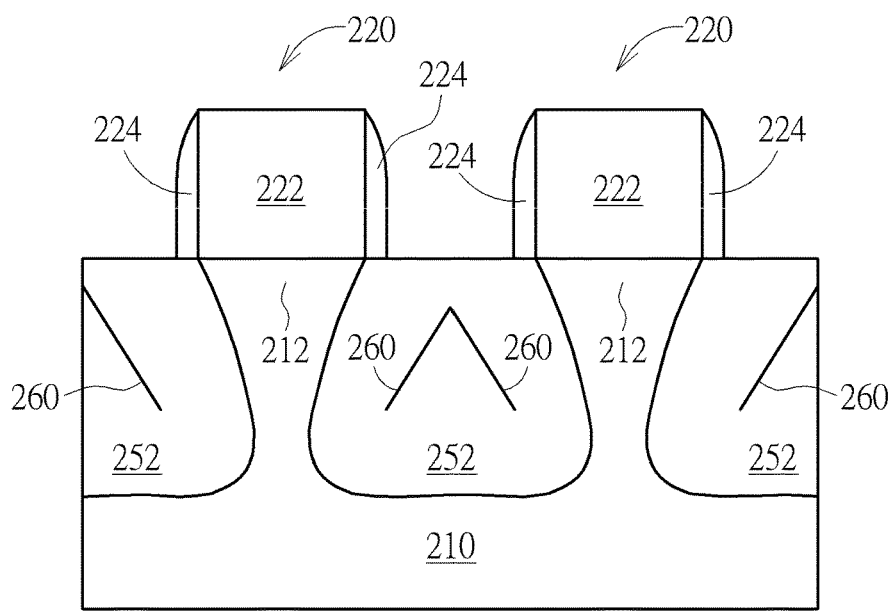
Figure 6:
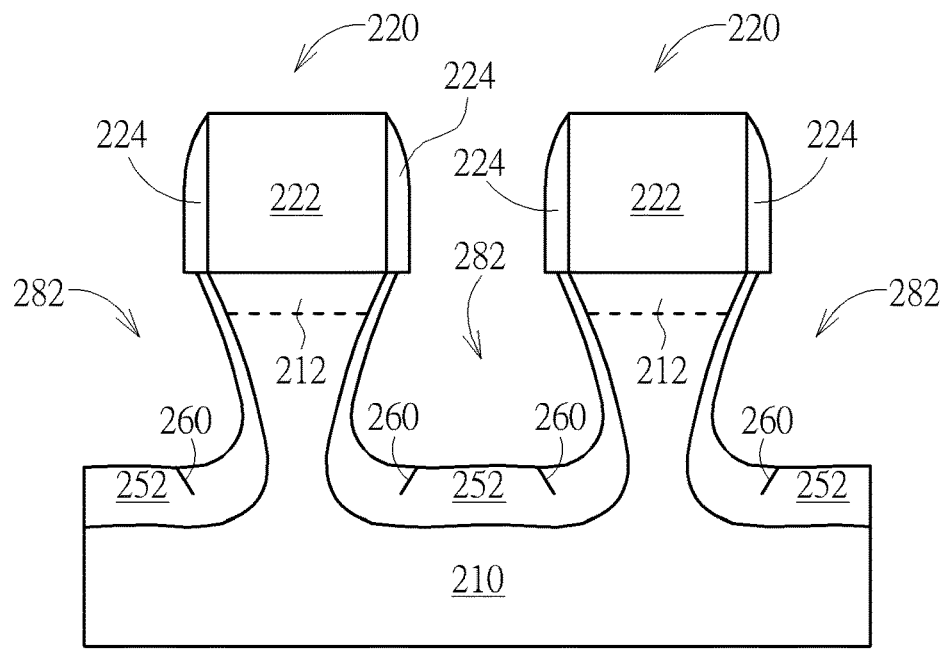

Referring to FIGS. 5-6, the stress film 240 is removed from the substrate 210. In some embodiments, the formation of spacers, PAI process, formation of stress film, annealing, and removal of stress film described above are repeated a number of times to create multiple dislocations.

Afterwards, as shown in FIG. 6, at least one recess 282 is formed by at least one etching process. In some embodiments, the etching process includes a dry etching process, wet etching process, or combination thereof. In some embodiments, the dry and wet etching processes have tunable etching parameters, such as etchants used, etching temperature, etching solution concentration, etching pressure, etching time, and other suitable parameters. In some embodiments, a patterned photoresist layer is utilized to define where the recess 282 is formed and protect other regions of the semiconductor device 200 from implantation damage. For example, in some embodiments, the PMOS regions are protected. In addition, the patterned photoresist layer exposes the source/drain regions, such that the source/drain regions are exposed to the dry etch process 280 (forming recess 282) while the gate structure 220 (and other portions of the semiconductor device 200) are protected from the etch process 280. For example, in some embodiments, the dry etching process utilizes an etchant that includes $NF_3$, $C_{12}$, $SF_6$, He, Ar, $CF_4$, or combinations thereof. The wet etching solutions include NH4OH, HF (hydrofluoric acid), TMAH (tetramethylammonium hydroxide), other suitable wet etching solutions, or combinations thereof.

Figure 7:
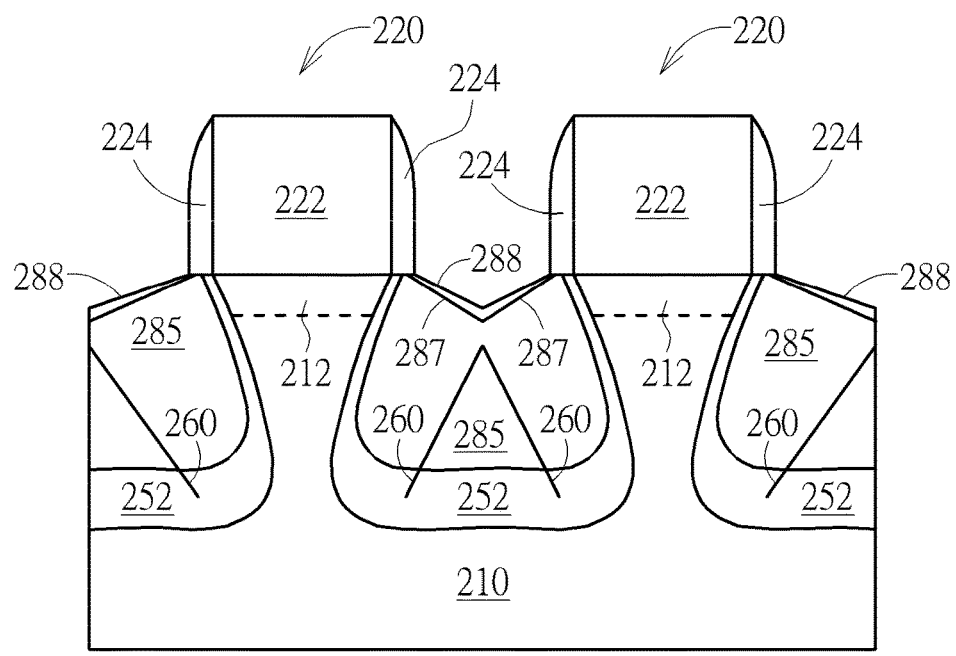

Afterwards, as shown in FIG. 7, an epitaxial layer 285 is formed in each recess 282. In some embodiments, the epitaxial layer 285 is formed by performing an epitaxial deposition process. In some embodiments, the material of the epitaxial layer 285 includes SiC, SiCP, SiP or other material that produces tensile strain on the transistor channel region, and the tensile strain is used for improving the performance of an NMOS. In addition, the epitaxial layer 285 can be used as the source/drain regions of the semiconductor device (such as an NMOS transistor). The epitaxial layer 285 has a V shaped profile top surface 288.

Figure 7A:
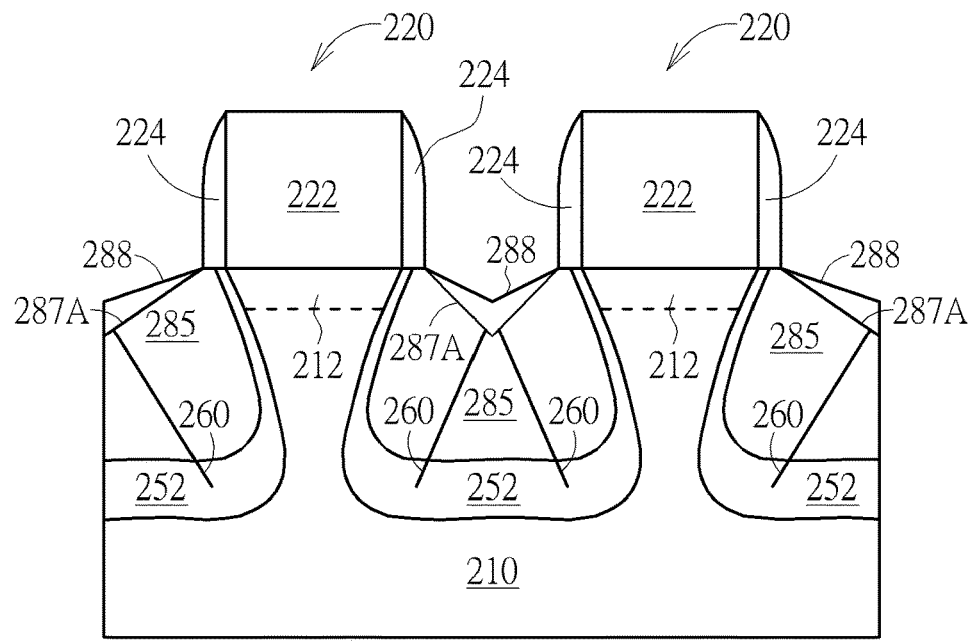
FIG. 7A shows the cross-sectional side view of a semiconductor device according to another embodiment of the present invention.

It is noteworthy that after the epitaxial layer 285 is formed, the first dislocation 260 is extended from the re-crystallization region 252 into the epitaxial layer 285. Therefore, the profile of the first dislocation 260 includes two non-parallel slanting lines. Preferably, the intersection of the two non-parallel slanting lines or its extending line is disposed above the first dislocation 260, so the first dislocation 260 has a reverse-V shaped profile in the epitaxial layer 285. Besides, the applicant found that during the formation of the epitaxial layer 285, if the distance between two gate structures 220 is small enough, since the epitaxial layer 285 is not easy to be formed on the surface of the spacer 224 and the epitaxial layer 285 will grow along a specific crystal surface, a second dislocation 287 can easily be formed near the top surface 288 of the epitaxial layer 285 while the epitaxial layer 285 touches the spacer 224. The second dislocation 287 also comprises two non-parallel slanting lines. Preferably, the intersection of the two non-parallel slanting lines or its extending line is disposed below the second dislocation 287, so the second dislocation 287 has a V shaped profile in the epitaxial layer 285. In addition, the second dislocation 287 contacts the spacer 224 directly. In one embodiment, as shown in FIG. 7, the first dislocation 260 does not overlap with the second dislocation 287; in another embodiment, as shown in FIG. 7A, the first dislocation 260 partially overlaps with the second dislocation 287.

Figure 7B:
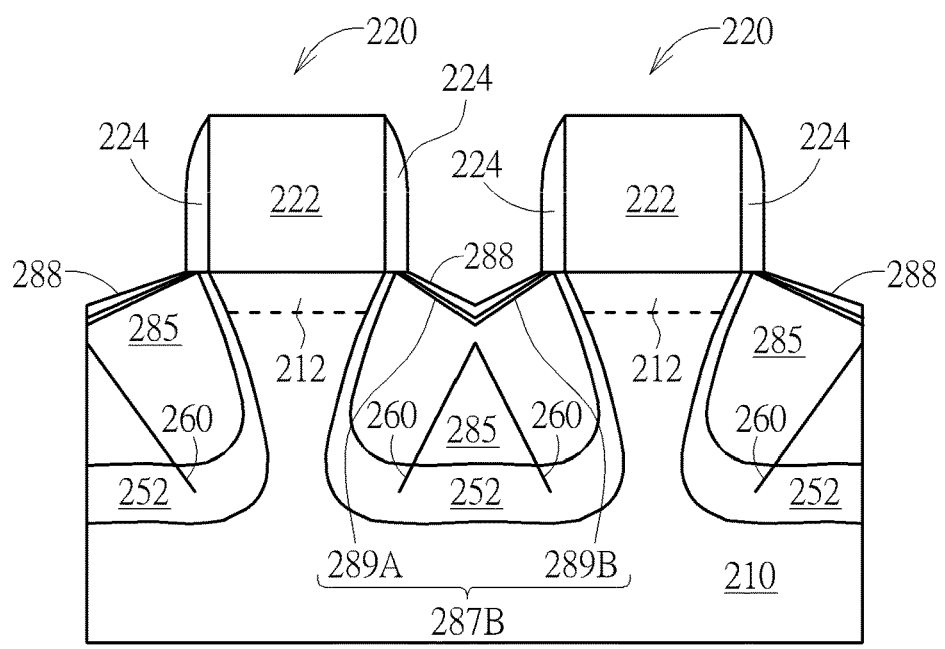
FIG. 7B shows the cross-sectional side view of a semiconductor device according to another embodiment of the present invention.
Figure 7C:
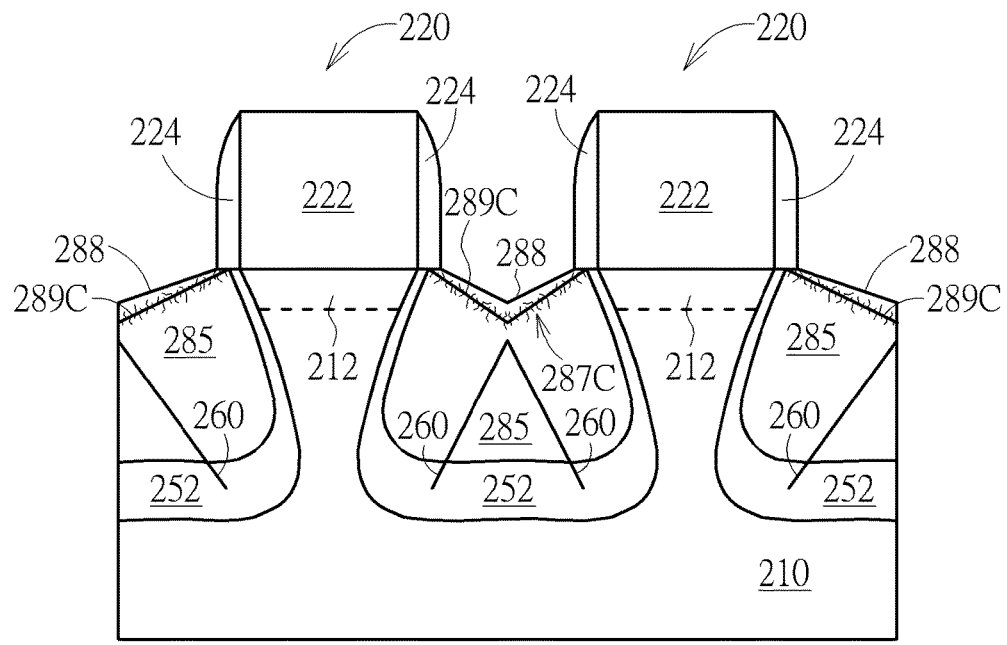
FIG. 7C shows the cross-sectional side view of a semiconductor device according to another embodiment of the present invention.

In another embodiment, as shown in FIG. 7B, during the formation for forming the epitaxial layer 285, since the epitaxial layer 285 touches the spacer 224, causing the second dislocation 287B to be formed in the epitaxial layer 285 repeatedly. In this case, the second dislocation 287B may include at least two parallel first lines 289A and two parallel second lines 289B, but the first line 289A and the second line 289B are not parallel to each other. Preferably, the first line 289A and the second line 289B or their extending lines compose a V shaped profile. Besides, in another case, as shown in FIG. 7C, during the formation for forming the epitaxial layer 285, the second dislocation 287B is formed in the epitaxial layer 285 repeatedly, so the profile of the second dislocation 287C may include a plurality of irregular branches 289C, and it should also be within the scope of the present invention.

Figure 7D:
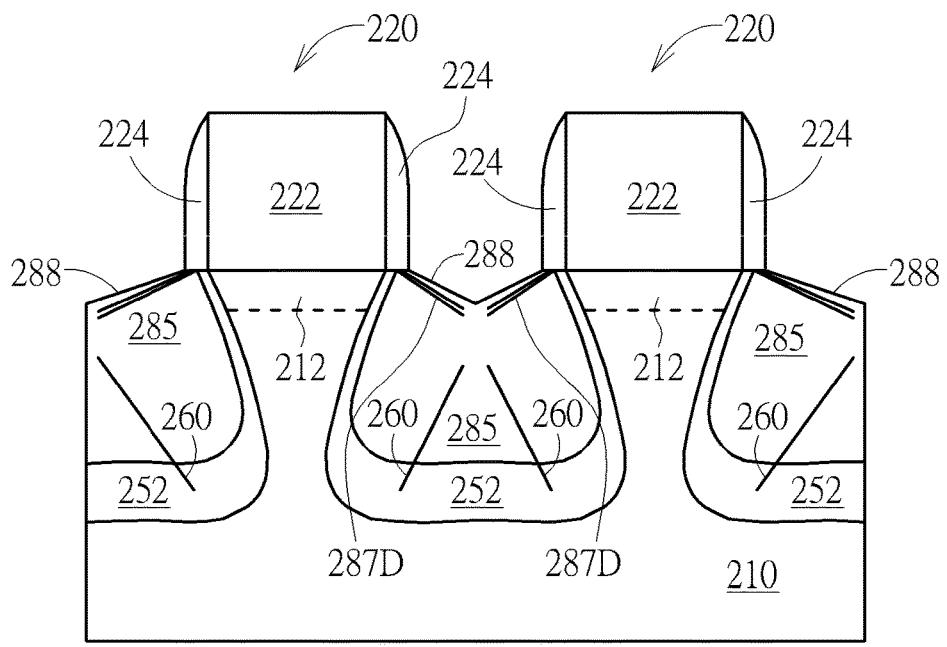
FIG. 7D shows the cross-sectional side view of a semiconductor device according to another embodiment of the present invention.
Figure 7E:
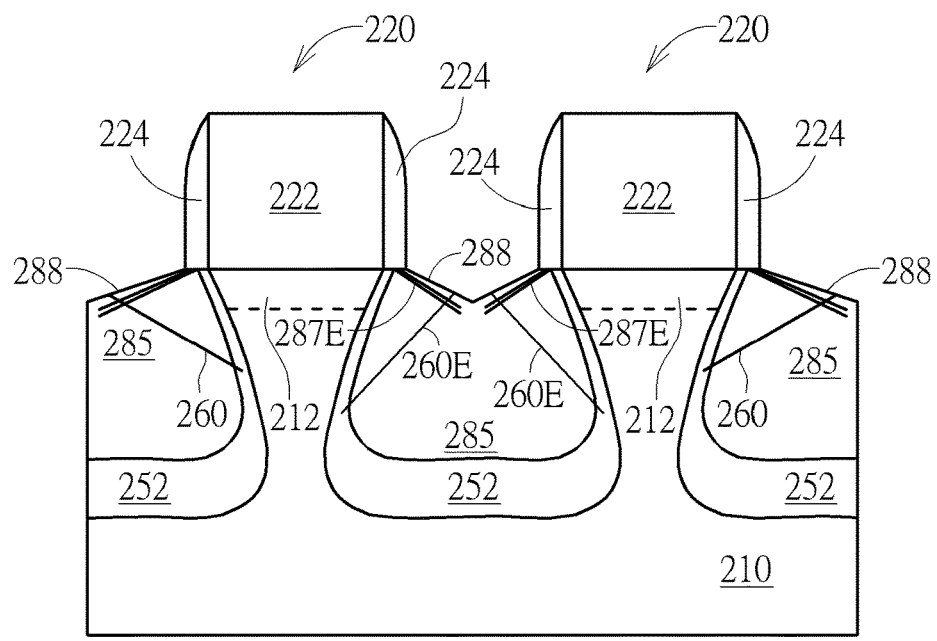
FIG. 7E shows the cross-sectional side view of a semiconductor device according to another embodiment of the present invention.

In an embodiment, as shown in FIG. 7D, the profile of the first dislocation 260 includes two non-parallel slanting lines, but these two non-parallel slanting lines do not touch each other. Similarly, the profile of the second dislocation 287D also includes two non-parallel slanting lines, and these two non-parallel slanting lines do not touch each other either. Or as shown in FIG. 7E, the first dislocation 260E partially overlaps with the second dislocation 287E, and it should also be within the scope of the present invention.

Figure 8:
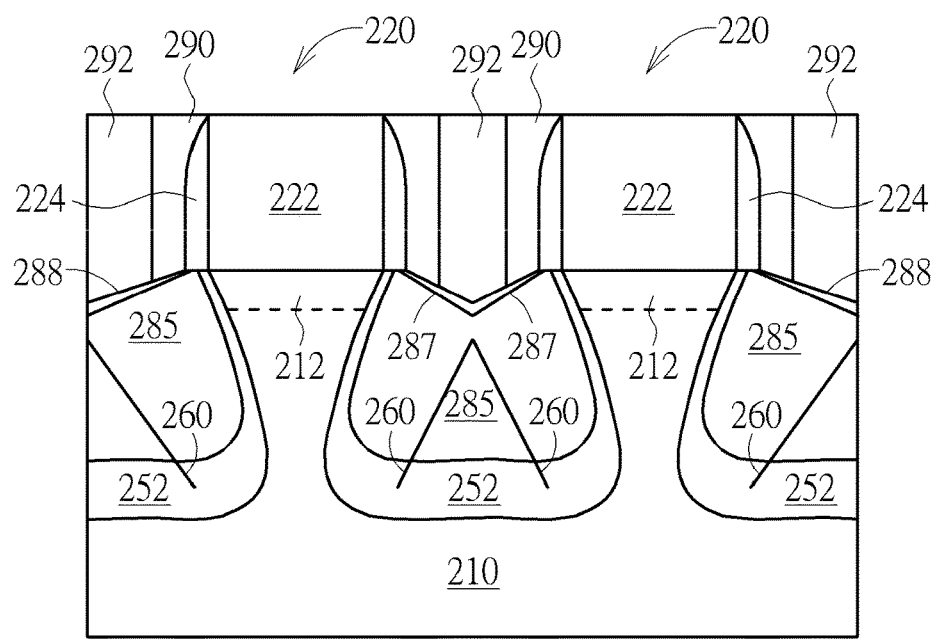
FIG. 8 illustrates diagrammatic cross-sectional side view of a semiconductor device according to the method of FIG. 1.

Finally, as shown in FIG. 8, a dielectric layer 290 is formed on the epitaxial layer 285, and a plurality of contact plugs are formed in the dielectric layer 290. The material of the contact plug 292 may include copper, tungsten, and/or silicide. The contact plug 292 is disposed on the epitaxial layer 285, and parts of the contact plug 292 is disposed lower than a top surface of the substrate 210. Preferably, the epitaxial layer 285 has a V-shaped profile top surface 288, so the contact plug 292 also has a V-shaped profile bottom surface.

Figure 8A:
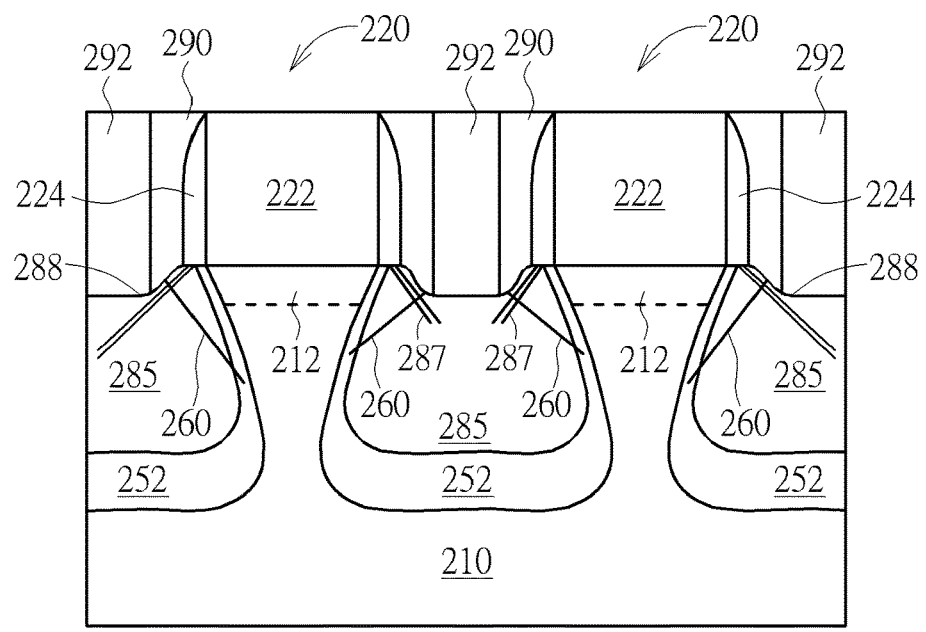
FIG. 8A shows the cross-sectional side view of a semiconductor device according to another embodiment of the present invention.

In another case, as shown in FIG. 8A, part of the contact plug 292 is embedded into the epitaxial layer 285, and the first dislocation 260 partially overlaps with the second dislocation 287. It should also be within the scope of the present invention.

The embodiments of processes and structures described above provide mechanisms for improving mobility of carriers. The dislocations in the source and drain regions and the tensile stress created by the doped epitaxial materials next to the channel region of a transistor both contribute to the tensile stress in the channel region. In particular, the tensile stress is good for improving the mobility of carriers of an NMOS transistor. In the present invention, except for the first dislocation being formed within the epitaxial layer, at least one second dislocation is formed near the surface of the epitaxial layer, and both the two dislocations contribute to the tensile stress, thereby further improving the device performance.

Figure 9:
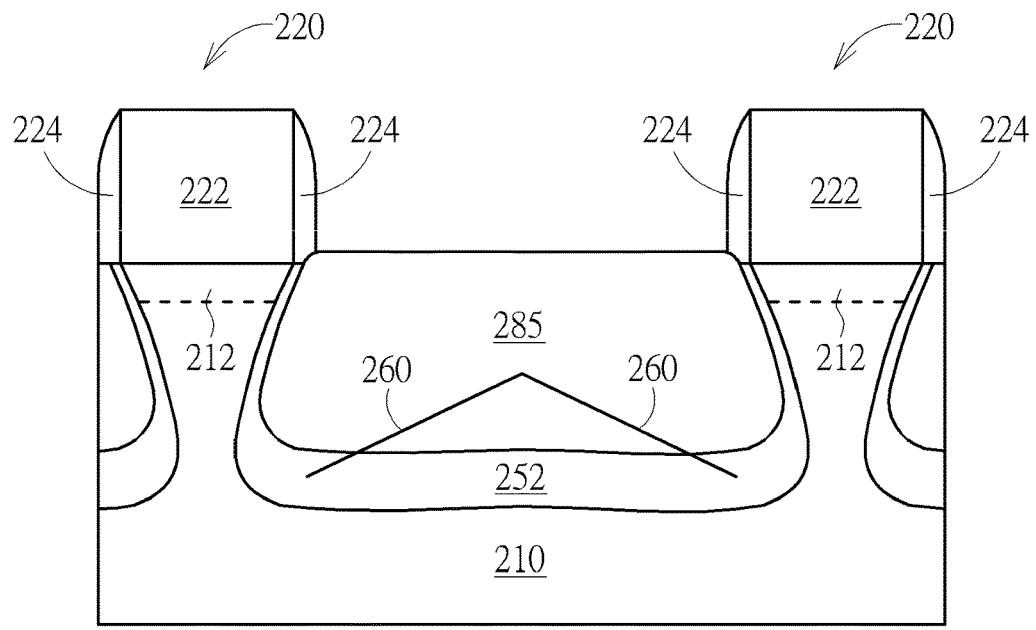
FIG. 9 shows the cross-sectional side view of a semiconductor device according to another embodiment of the present invention.

Besides, FIG. 9 shows the semiconductor device according to another embodiment of the present invention. When the distance between two gate structures 220 is large enough, even though the epitaxial layer 285 touches the spacer 224 during the formation process, since the distance between two gate structures 220 is relatively large, the epitaxial layer 285 will not grow along a specific crystal surface, and the second dislocation 287 shown in FIG. 8 will not be formed either. In this case, the epitaxial layer 285 only comprises the first dislocation 260 disposed therein, and the epitaxial layer 285 has a flat top surface.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   two gate structures disposed on the substrate;
   an epitaxial layer disposed in the substrate between two gate structures;
   a second dislocation disposed adjacent to a top surface of the epitaxial layer, and the profile of the second dislocation has at least two non-parallel slanting lines, and the two non-parallel slanting lines compose a V profile;
   a first dislocation disposed in the epitaxial layer, wherein the profile of the first dislocation has at least two non-parallel slanting lines, and the two non-parallel slanting lines compose a reverse V profile, and wherein the first dislocation does not contact a top surface of the epitaxial layer directly, and an intersection point of the at least two non-parallel slanting lines of the first dislocation is disposed in the epitaxial layer, wherein the intersection point is disposed below the top surface of the epitaxial layer; and
   a contact structure directly contacts the top surface of the epitaxial layer, wherein part of the contact structure is disposed lower than a top surface of the substrate.

2. The semiconductor device of claim 1, wherein the contact structure comprises silicide.

3. The semiconductor device of claim 1, wherein the contact structure has a bottommost surface with a V-shaped profile.

4. The semiconductor device of claim 3, wherein the bottommost surface of the contact structure directly contact with the second dislocation.

5. The semiconductor device of claim 1, wherein the gate structure is a gate structure of an n-type metal-oxide-silicon (NMOS) field-effect transistor (FET).

6. The semiconductor device of claim 1, wherein the material of the epitaxial layer includes SiC, SiP, or SiCP.

7. The semiconductor device of claim 1, further comprising two spacers each respectively disposed on two sides of each gate structure, wherein the second dislocation contacts the spacer directly.

8. A semiconductor device, comprising:
   a substrate;
   two gate structures disposed on the substrate;
   an epitaxial layer disposed in the substrate between two gate structures, wherein a bottom portion of the epitaxial layer is larger than a top portion thereof;

a second dislocation disposed adjacent to a top surface of the epitaxial layer, and the profile of the second dislocation has at least two non-parallel slanting lines, and the two non-parallel slanting lines compose a V profile, and an intersection point of the at least two non-parallel slanting lines of the second dislocation is disposed in the epitaxial layer, wherein the intersection point is disposed below the top surface of the epitaxial layer; and a contact structure directly contacts the top surface of the epitaxial layer, wherein part of the contact structure is disposed lower than a top surface of the substrate.

9. The semiconductor device of claim 8, wherein the contact structure comprises silicide.

10. The semiconductor device of claim 8, wherein the contact structure has a bottommost surface with a V-shaped profile.

11. The semiconductor device of claim 10, wherein the bottommost surface of the contact structure directly contact with the second dislocation.

12. The semiconductor device of claim 8, wherein the gate structure is a gate structure of an n-type metal-oxide-silicon (NMOS) field-effect transistor (FET).

13. The semiconductor device of claim 8, wherein the material of the epitaxial layer includes SiC, SiP, or SiCP.

14. The semiconductor device of claim 8, further comprising two spacers each respectively disposed on two sides of each gate structure, wherein the second dislocation contacts the spacer directly.

* * * * *